United States Patent
Muldoon

(10) Patent No.: US 6,822,344 B2
(45) Date of Patent: Nov. 23, 2004

(54) DETERMINATION OF AC PATH STATES BY FLOATING CONTROLS

(76) Inventor: Alfred Wade Muldoon, 2603 Willa Dr., St. Joseph, MI (US) 49085

( * ) Notice: Subject to any disclaimer, the term of this patent is extended or adjusted under 35 U.S.C. 154(b) by 201 days.

(21) Appl. No.: 10/082,455

(22) Filed: Feb. 25, 2002

(65) Prior Publication Data

US 2003/0160512 A1 Aug. 28, 2003

(51) Int. Cl.$^7$ ................................................. H02J 1/00
(52) U.S. Cl. ........................... 307/38; 307/39; 307/139; 307/141.8; 327/451; 327/456
(58) Field of Search ........................... 307/38, 39, 139, 307/141.8; 327/451, 456

(56) References Cited

U.S. PATENT DOCUMENTS

| | | | |
|---|---|---|---|
| 3,862,439 A | * 1/1975 | Coccio | 327/451 |
| 3,944,909 A | * 3/1976 | Reymond | 323/263 |
| 4,305,122 A | * 12/1981 | Smith et al. | 700/15 |
| 4,329,596 A | * 5/1982 | Marcade | 307/141.8 |
| 4,594,515 A | * 6/1986 | Hummel | 327/456 |
| 4,866,955 A | * 9/1989 | Blair et al. | 68/12.23 |
| 5,184,026 A | * 2/1993 | O Breartuin | 307/139 |
| 5,202,582 A | * 4/1993 | Szynal et al. | 307/39 |
| 5,694,793 A | * 12/1997 | Nishimura et al. | 68/12.27 |
| 5,735,007 A | * 4/1998 | Choi | 8/159 |
| 5,760,493 A | * 6/1998 | Outcalt et al. | 307/38 |

* cited by examiner

*Primary Examiner*—Robert L. DeBeradinis

(57) ABSTRACT

An electronic control, with a floating ac power supply, that compares the digital signals produced by connections between ac circuit nodes and digital nodes to determine whether path(s) in ac circuits containing the ac nodes are intact or open. The connections are made through passive components which limit the current between nodes to levels the digital devices can safely handle. An open path indicates to the control that a switching device is open, a connection has failed, or a that a load component has failed or is missing. An intact path indicates a closed switch or a present and presumably functional load component. Proper connections enable the control to detect the state of multiple paths while still being able to detect zero crossings. The method can determine the state of ac paths even if hot and neutral connections are inadvertently reversed.

20 Claims, 4 Drawing Sheets

2A

2B

2C

2D

2E

DETERMINATION OF AC PATH STATES BY FLOATING CONTROLS

CROSS-REFERENCE TO RELATED APPLICATIONS

Not Applicable

STATEMENT REGARDING FEDERALLY SPONSORED RESEARCH

Not Applicable

REFERENCE TO SEQUENCE LISTINGS

Not Applicable

BACKGROUND OF THE INVENTION

The present invention relates to electronic controls that must determine if a path of an ac circuit is intact or open. Typically this means determining whether a switching component is open or closed, or a whether a functional component is present.

Typically the state of a component that switches an ac load is determined using optoisolators or other active components to interface ac voltages to electronic control level voltages. Alternatively a low voltage switch acting in unison with the ac switch is read by the control to indirectly determine the state of the ac switch. One prior passive component approach with an isolated supply requires a conditioning circuit between ac nodes and works only when the neutral line is the one switched. Other prior passive component approaches only work on supplies that are not isolated from ac. They require a fixed voltage between the control voltages and the ac source.

The approach of using optoisolators or active components requires the use of multiple components for each input to the control. Typically these components include at a minimum an optoisolator, a current limiting resistor on the input and a pull-up resistor on the output. The cost of these components and their assembly add significantly to the cost of electronic controls. The use of active components and the number of components reduce the reliability of this approach.

Using a separate control voltage switch incurs the expense of the switch and the extra connectors and wires to interface it to the control. There is additional expense of mounting hardware and labor. The reliability of mechanical systems is typically far less than a solid state approach.

A technique to interface an electronic control to ac using a resistor, is shown in AN521 of Microchip's Embedded Control Handbook. In this approach the ground of the control is in common with the ac ground establishing ground as a reference. A resistive connection to hot produces ac source frequency pulses. There is no mention of a means of detecting the state of a node whose connections to hot and/or neutral are not already known. This approach relies on the fixed reference of the common ground that is not present with a floating supply. Proper connections to hot and neutral are assumed. If L1 and neutral were inadvertently reversed in installation the technique will not work.

U.S. Pat. No. 5,202,582 shows a method to determine the state of an ac switch connecting the load to neutral for a floating control using passive components. This approach requires a conditioning circuit with connections to L1, the load side of the switch and a control input. It is designed to determine solely the state of a ground side switch of an ac circuit. The conditioning circuit shapes signal. The shape determines the state of the switch.

This method assumes the correct connections to ac are made during installation, something that is not under the control of the manufacturer. Further this approach requires that neutral be switched leaving the transducers connected to hot unless a L1 side switch is also opened when the door is opened. Finally no method is shown to sense the state of a plurality of ac switches in the same circuit or a plurality of circuits.

U.S. Pat. No. 5,184,026 shows a method that can be used for a plurality of switches. However the method deals with controls whose supply voltages are not isolated from the ac source. Supplies that are not isolated bring the possibility of shock or worse should the operator come in contact with any control voltage. As described the monitoring device requires a reference voltage that is a dc drop from the instantaneously higher of the source lines. To produce such a reference requires multiple components and connections between the source and the control. The monitoring device must include a reactive component to block the dc voltage between the ac node and the control for this approach to work. The reactive components used to block dc alter the phase of signal received by the control.

BRIEF SUMMARY OF INVENTION

The present invention connects ac nodes and digital nodes of a control with a floating power supply to determine the state of ac path(s) in the circuit containing the ac nodes. The digital nodes of the present invention are either digital inputs or the supply voltages for the digital circuitry. The connections are made through passive components. The ac potential between the source and the control drives the digital nodes. The subsequent signals on digital nodes are compared to determine the state of ac path(s).

The present invention can determine the state of a plurality of ac paths. The paths may be anywhere in the ac circuit. The state of the path indicates whether it is intact or open. The state of a path can be used to determine the state of a switching means. It can also determine if a functional load component is present. The present invention can also determine if an ac node is floating indicating that all ac paths to the node are open.

The method may be applied to devices where the polarity of the connection to the ac source is unknown. The method may be used to detect zero crossings. The high impedance connections allow inputs to perform other I/O functions when not reading the state of an ac node. The aggregate source-control impedance may be made sufficient to limit the current to a safe level, preferably below the threshold of sensation, should the operator contact any control node.

The simplest connection, one made by a resistor, is the preferred connection. It ensures that if the digital input has a phase it is the same phase as the driving ac signal. While reactive (energy storing) components may be used in the connections to further distinguish signals they are not required, alter the phase of the signal and add to the cost.

The reliability of the present invention is much greater than the prior approaches given the reduction in the number of interface components. Additionally resistors, the preferred passive component in the connections, are most reliable electrical components.

DETAILED DESCRIPTION OF THE INVENTION

Although both the following embodiments are 120 vac dishwashers it is to be understood that the inventor contemplates the invention being applied to other devices with the same or different ac transducers and switching means operating off various ac voltages.

First Embodiment

Figure 1:
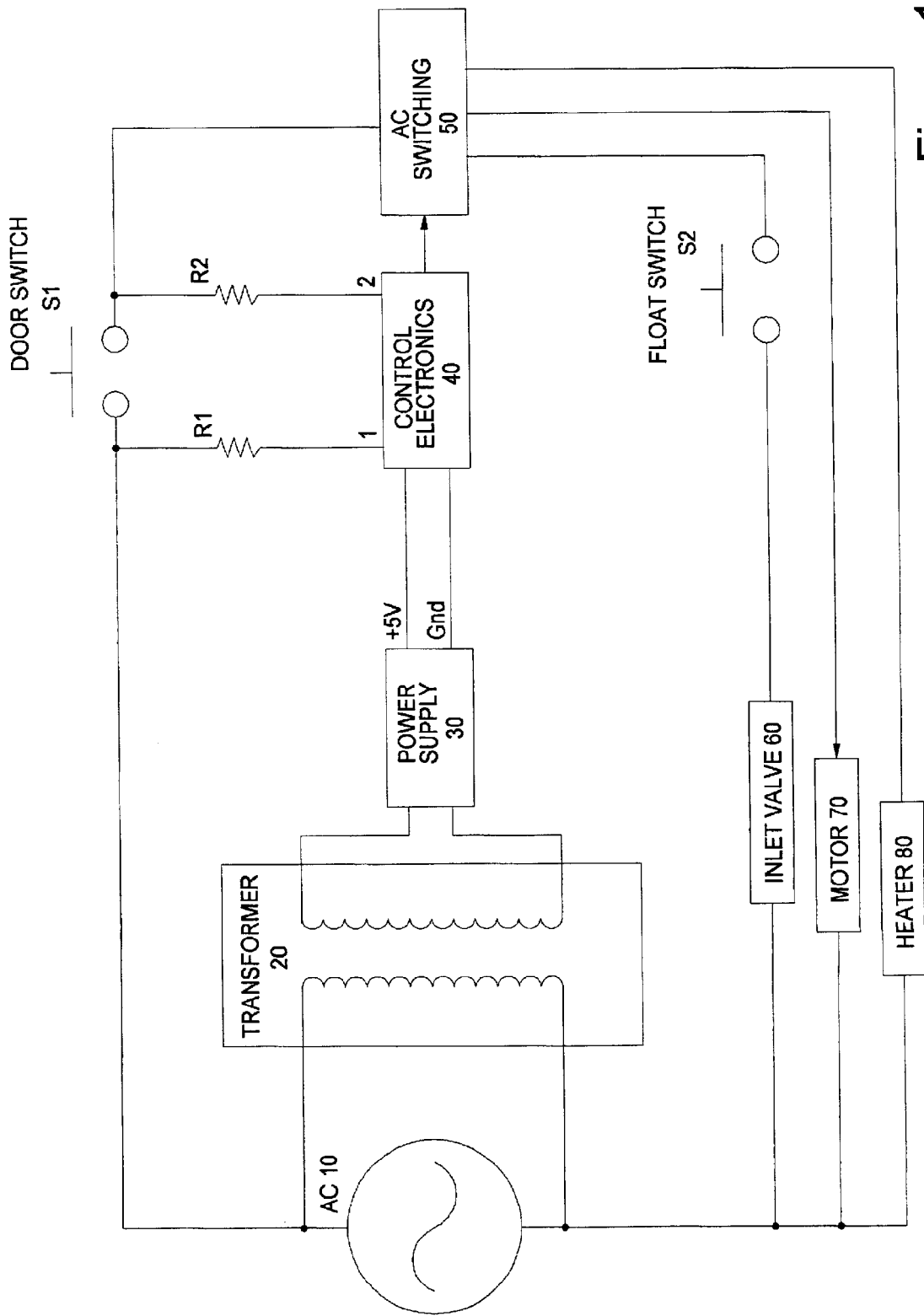
FIG. 1 is the schematic of the control used to operate the dishwasher in the first embodiment.

This embodiment is a dishwasher control. The schematic for the first embodiment is shown in FIG. 1. The ac transducers are a motor 70, a heating element 80 and a solenoid 60 operating a water inlet valve. Operation of the motor 70 and the heating element 80 can be stopped by either the door switch, S1 or the ac switching 50 operated by the control electronics 40. Operation of the inlet valve solenoid 60 can be interrupted by the ac switching 50, the door switch S1 or the float switch S2.

When correctly installed, line L1 of the ac source is connected to S1 and neutral is connected directly to solenoid 60, motor 70 and heating element 80. The input of transformer 20 is also connected to the ac source 10. The power supply 30 is connected to the output of transformer 20. The power supply 30 produces dc voltages, +5 v and Gnd, for the control electronics 40 and the input side of the ac switching 50. The output of the power supply 30 is isolated from the ac source by 20. The control electronics 40 selectively activate the ac transducers using the ac switching module 50. While this embodiment uses a linear power supply the approach is the same for any isolated power supply.

During a wash cycle the control activates and times the operation of each transducer. The control must measure only the time a transducer is active, hence it must be able to determine the state of the door switch S1. When S1 is opened during transducer operation the control suspends its operation until S1 is once again closed. The water fill is timed, S2 does not open during normal operation. S2 remains closed unless a fault causes the dishwasher to overfill. The control does not monitor the state of S2.

In this embodiment of the present invention the control compares the signals received through resistors R1 and R2 to determine the state the ac path containing the door switch, S1. R1 is connected between the unswitched ac source side of S1 and digital input 1 of the control electronics 40. R2 is connected between the opposing side of S1 and digital input 2 of 40. Both inputs have high impedance. Input 1 also serves as a designated counter used to time operation by counting the pulses on its input. The control 40 uses the 60 hz signal produced on input 1 to accurately time the operation of the dishwasher. This means the only component unique to determining the state of S1 is R2.

When S1 is opened during operation of any transducer, S1 is the only break in the ac circuit. The 60 hz signals on inputs 1 and 2 are 180° out of phase as shown in FIGS. 2A and 2B. When input 1 is high, input 2 is low. When 2 is high 1 is low. This is true regardless of the polarity of the connection to the ac source 10. The signals are the portions of the 60 hz sinusoidal wave of the ac source 10 truncated by internal protection diodes of inputs 1 and 2. The signals are limited to +5.6 v and −0.6 v as long as R1 and R2 have sufficient resistance to limit the current through the protection diodes. Further R1 and R2 limit the current from the ac source 10 to less than the threshold of sensation providing shock protection in the event the operator contacts a control level node.

When the door switch S1 is closed, inputs 1 and 2 received the same signal (FIG. 2A) since R1 and R2 are connected to the same ac potential. In this embodiment the intrinsic impedance between the supply voltages and the source 10 complete the input-source loop. The high input impedance of 1 and 2 ensure that the fraction of the ac source voltage dropped across these inputs is sufficient to alter the state of each input. Thus anytime 1 and 2 are both high or both low S1 is closed.

In this embodiment there is no need to determine the state of S1 when no transducer is selected since the operation of the control is unaffected. Should the operation call for the activation of a transducer when the door has previously been opened, the control will use the ac switching means 50 to select the transducer. After a transducer is selected the control will detect the open door just as it would when the door is opened when a transducer is active. The control will then suspend operation until S1 is closed.

If it were necessary to determine the state of S1 when no transducer is selected by 50 the control must be able to determine that the ac node of R2 is floating, isolated from both L1 and neutral. When the switched side of S1 is isolated, the signal at 2 has approximately a 90° phase shift to the signal on 1 as shown in FIG. 2C. The signal is caused by the intrinsic impedance between the source and the switched side node of S1. The signal on 2 will not be low the entire time 1 is high as it is when S1 is the only break in the circuit. Scanning is done over the period 1 is high. If 2 is goes low anytime during this period S1 is open.

While the ability to distinguish when the R2 ac node is floating adds no expense in term of hardware the trade off is in more involved scanning. When the only signals the control needs to detect are those in FIGS. 2A and 2B detection can be made at any instant other than when the signals are changing state. The second embodiment demonstrates a means of connecting to ac nodes so that the scan to detect floating nodes is simplified.

Second Embodiment

Figure 3:
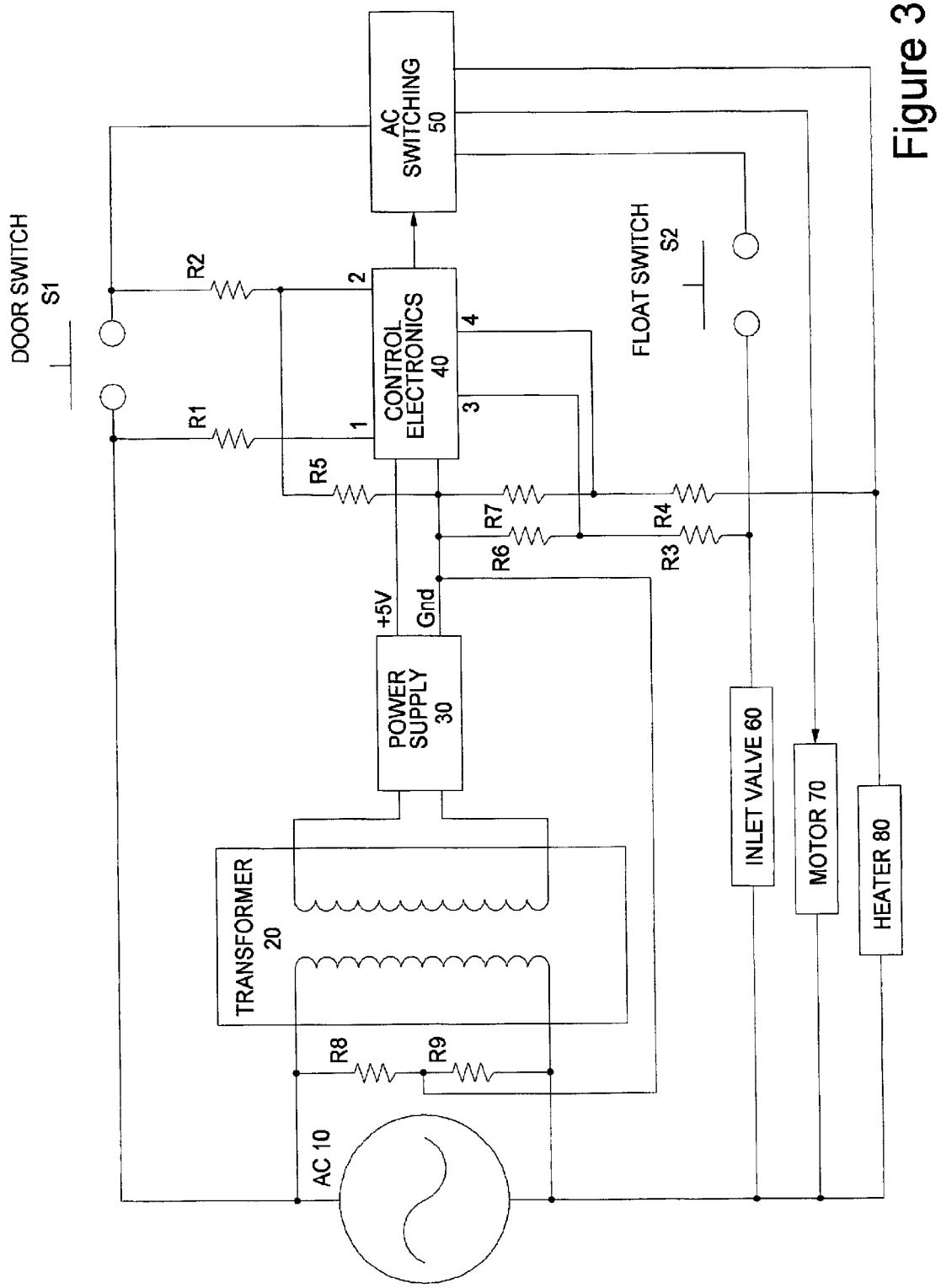
FIG. 3 is the schematic of the control used to operate the dishwasher in the second embodiment.

In this embodiment resistors R3–R9 are added to the control as shown in FIG. 3. Components introduced in the first embodiment perform the same function unless noted in the text. The mechanics of the washer are the same as the first embodiment except fill stops when the float switch S2 opens rather than being timed. This control monitors the states of S1 and S2. The control also monitors the functionality of inlet solenoid 60 and heating element 80 by connecting resistors R3 and R4 between them and inputs 3 and 4 respectively.

Figure 2:
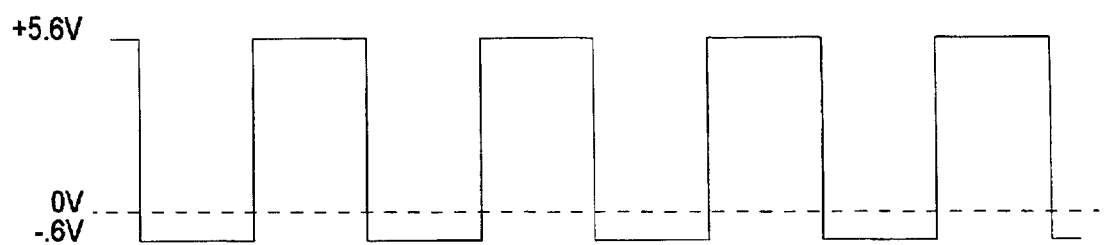
FIGS. 2A-E are graphs of voltage versus time occurring on the inputs of the controls in the first and second embodiments.
Figure 2:
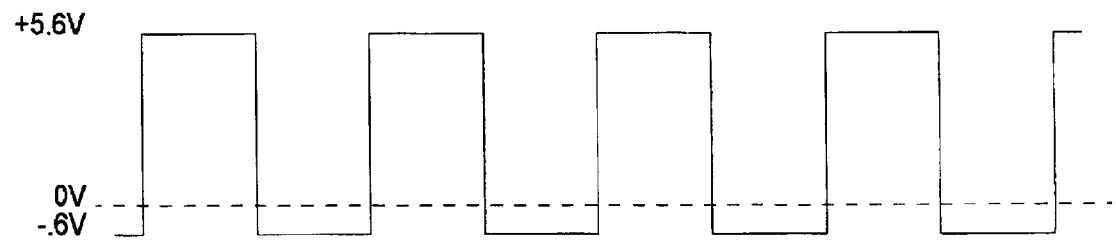
Figure 2:
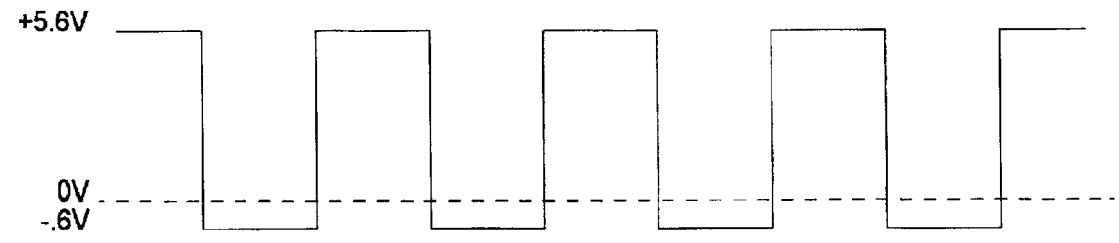
Figure 2:
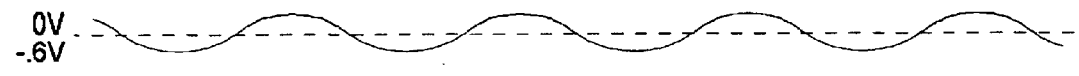
Figure 2:
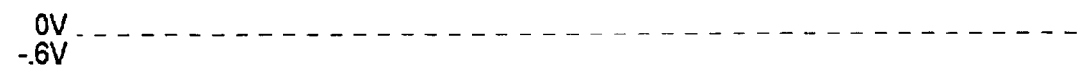

In this embodiment resistors R5–R7 reduce the impedance between inputs 2–4 and control ground. Instead of the signal in FIG. 2C, a floating node in this embodiment produces the signal in FIG. 2D. The small magnitude of this signal ensures that it is read as a fixed low. Unlike the signals in FIGS. 2A-C this signal has no detected phase. In FIG. 2, the signal in 2D is easier to distinguish than the signal in 2C from the signals in 2A and 2B. In this embodiment the simplified scanning required to distinguish the 2D signal allows the use of a lower cost CPU (not shown) with less memory thus recovering the cost of including R5–R7.

R8 and R9 bias the control relative to the source ensuring that when a sensed ac node is at either line potential the signal in FIGS. 2A or 2B is produced. Choosing R9<R8<<R1–R4 performs two functions: 1) it biases the control nearer what is nominally neutral allowing a state change on input 1 to serve as a zero crossing detector. 2) when the ac nodes for inputs 1–4 are at the same line potential it prevents the control from becoming so closely biased to that ac line that the signal on inputs 2–4 would be reduced to the signal in FIG. 2D. Thus in this embodiment only floating ac nodes produce a fixed low signal.

In this embodiment the state of S1 is again determined by comparing the signal on input 1 with the signal on input 2. When S1 is closed both inputs have the signal in FIG. 2A. When S1 is open, the signal on 1 remains the one in FIG. 2A. FIG. 2B shows the signal on 2 when S1 is open with a transducer selected. FIG. 2D shows the signal on 2 when S1 is open with no transducer selected. R5 lowers the input impedance sufficiently to maintain 2 in the low digital state when its ac node is floating. The signals in FIGS. 2B and 2D are both low when 1 is high. Hence S1 is open if 2 is low when 1 is high. S1 is closed if 2 is high when 1 is high. When S1 is open the control suspends operation.

In this dishwasher S2 determines the fill level. S2 is closed until the fill level is reached when it opens breaking the circuit of the solenoid 60. During fill the signals on inputs 2 and 3 are compared. They are in phase until S2 opens. This is true regardless of the state of S1. If S1 remains closed when S2 is open the signals on inputs 2 and 3 are those of FIGS. 2A and 2B. If both S1 and S2 open the signals are those of FIGS. 2D and 2B. Thus if input 2 is low when input 3 is high S2 is open. When S2 opens the control proceeds to the next step in the wash cycle after the fill.

To determine the functionality of the solenoid 60 and the heating element 80 the control scans their paths when their transducers are inactive. An intact path indicates a functional transducer. If a path is open, its transducer is non-functional either because it or a part of the circuit has failed. The signal on input 1, FIG. 2A, is used as a reference. A functional component will produce the signal in FIG. 2B regardless of the polarity of the connections to ac 10. If the transducer is non-functional the ac node tested will be floating producing a fixed low signal (FIG. 2D) on its digital input. Inputs 3 and 4 are scanned when 1 goes low. If 3 is high the solenoid 60 is functional. If 4 is high the heating element 80 is functional. If 3 is low 60 is non-functional. If 4 is low 80 is non-functional.

All connections of the present invention, not just R8 and R9 together with the intrinsic impedance between all nodes and the source bias the control relative to the source. When an ac path state produces the signal in FIG. 2D and/or FIG. 2E a supply node can be used as a reference signal. In the circuit in FIG. 3 ground can be used as a reference signal to determine the functionality of the heating element 80 and the inlet valve 60 respectively. If either input remains at zero for one ac source period, 16.7 msec, its respective transducer has failed.

Figure 4:
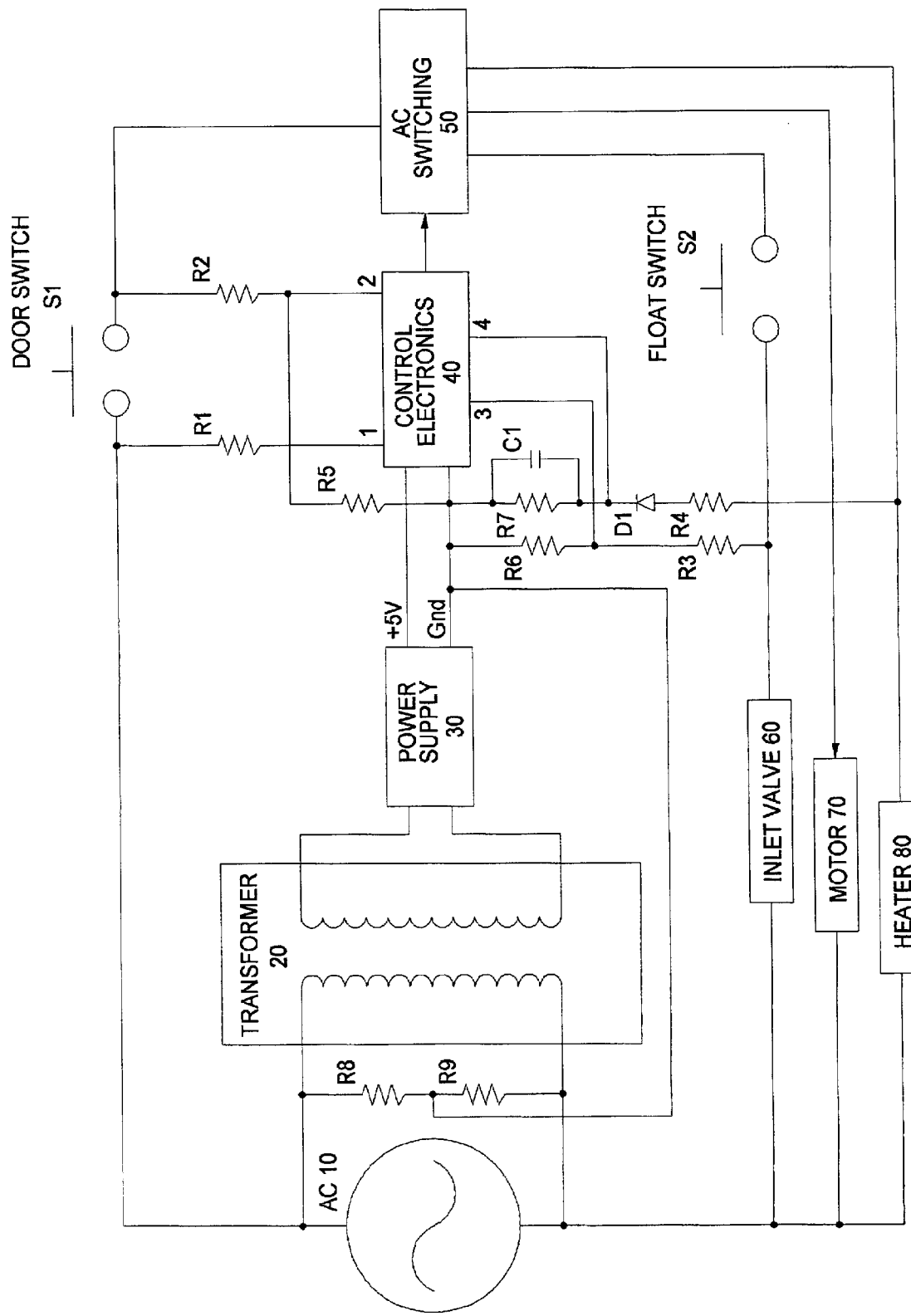
FIG. 4 is the schematic of the optional control used to operate the dishwasher in the second embodiment.

Neither method can determine the functionality of the heating element 80 at any instant, though when the signal on input 1 is used as a reference functionality can be determined anytime 1 is low. The addition of diode D1 and capacitor C1 as shown in FIG. 4 removes the phase of the signal detected by the input 4. When 80 is functional the signal on input 4 as shown in FIG. 2E in. If 80 is non-functional the signal remains that in FIG. 2D. These signals can be distinguished at any instant.

In this embodiment, zero crossings are detected when input 1 changes state. The accuracy of this method depends on where the control ground is biased. The closer the control is biased to the source line not connected to R1 the greater the accuracy of the zero crossing. Without R8 and R9 the bias of the ground is dramatically changed by the state of S1, S2 and the ac switches 50. This is particularly true when all the transducers are active causing all tested ac nodes to be at the same potential as the unswitched side of S1. Selecting R9<R8 <<R1–R4 minimizes the affect the state of the ac nodes sensed by R1-R4 has on the bias of control ground.

In both of the embodiments the aggregate source-control impedance is sufficient to limit the current to below the threshold of sensation should the operator contact any digital node. To guard against a failure of the connecting components resulting in control failure or operator shock multiple components may be used instead of single units.

It is claimed:

1. An electronic control with a power supply that isolates control voltages from ac source voltages, said control having a plurality of electrical connections between digital nodes and ac nodes, said electrical connections being made through passive components, and subsequent signals on digital nodes being compared to ascertain the state of one or more ac paths.

2. The control in accordance with claim 1 wherein said ascertained state of at least one of said ac paths indicates whether an ac switching device is open or closed.

3. The control in accordance with claim 1 wherein said ascertained state of at least one of said ac paths indicates whether an ac functional load component is present.

4. The control in accordance with claim 1 wherein at least one of said signals is used to determine zero crossings.

5. The control in accordance with claim 1 wherein said passive components limit current from said ac source through an operator to a safe level should said operator contact any control node.

6. An electronic control with a power supply that isolates control voltages from the ac source voltages, said control having a plurality of electrical connections between digital nodes and ac nodes, said electrical connections being made solely through passive components, and subsequent signals on digital nodes being compared to ascertain the state of one or more ac paths.

7. The control in accordance with claim 6 wherein said ascertained state of at least one of said ac paths indicates whether an ac switching device is open or closed.

8. The control in accordance with claim 6 wherein said ascertained state of at least one of said ac paths indicates whether an ac functional load component is present.

9. The control in accordance with claim 6 wherein at least one of said signals is used to determine zero crossings.

10. The control in accordance with claim 6 wherein said passive components limit current from said ac source through an operator to a safe level should said operator contact any control node.

11. An electronic control with a power supply that isolates control voltages from ac source voltages, said control having a plurality of electrical connections between digital nodes and ac nodes, said electrical connections being made through non-reactive passive components, and subsequent signals on said digital nodes being compared to ascertain the state of one or more ac paths.

12. The control in accordance with claim 11 wherein said ascertained state of at least one of said ac paths indicates whether an ac switching device is open or closed.

13. The control in accordance with claim 11 wherein said ascertained state of at least one of said ac paths indicates whether an ac functional load component is present.

14. The control in accordance with claim 11 wherein at least one of said signals is used to determine zero crossings.

15. The control in accordance with claim 11 wherein said non-reactive passive components limit current from said ac source through an operator to a safe level should said operator contact any control node.

16. The control in accordance with claim 11 wherein said electrical connections are made solely through non-reactive passive components.

17. The control in accordance with claim 16 wherein said ascertained state of at least one of said ac paths indicates whether an ac switching device is open or closed.

18. The control in accordance with claim 16 wherein said ascertained state of at least one of said ac paths indicates whether an ac functional load component is present.

19. The control in accordance with claim 16 wherein at least one of said signals is used to determine zero crossings.

20. The control in accordance with claim 16 wherein said non-reactive passive components limit current from said ac source through an operator to a safe level should said operator contact any control node.

* * * * *